US009093393B2

(12) United States Patent
Suda

(10) Patent No.: US 9,093,393 B2
(45) Date of Patent: Jul. 28, 2015

(54) SEMICONDUCTOR DEVICE AND METHOD FOR PRODUCING THE SAME

(71) Applicant: J-DEVICES CORPORATION, Usuki (JP)

(72) Inventor: Toru Suda, Kawasaki (JP)

(73) Assignee: J-DEVICES CORPORATION, Usuki (JP)

( * ) Notice: Subject to any disclaimer, the term of this patent is extended or adjusted under 35 U.S.C. 154(b) by 0 days.

(21) Appl. No.: 14/083,834

(22) Filed: Nov. 19, 2013

(65) Prior Publication Data

US 2014/0138852 A1 May 22, 2014

(30) Foreign Application Priority Data

Nov. 19, 2012 (JP) ................. 2012-253070

(51) Int. Cl.
*H01L 23/48* (2006.01)
*H01L 23/31* (2006.01)
(Continued)

(52) U.S. Cl.
CPC .......... *H01L 23/3157* (2013.01); *H01L 21/563* (2013.01); *H01L 23/147* (2013.01); *H01L 23/49833* (2013.01); *H01L 23/49838* (2013.01); *H01L 24/05* (2013.01); *H01L 24/06* (2013.01); *H01L 24/32* (2013.01); *H01L 24/92* (2013.01); *H01L 25/00* (2013.01); *H01L 25/0657* (2013.01); *H01L 25/50* (2013.01); *H01L 23/3128* (2013.01); *H01L 23/49827* (2013.01); *H01L 23/556* (2013.01); *H01L 24/29* (2013.01); *H01L 24/48* (2013.01); *H01L 24/73* (2013.01); *H01L 24/81* (2013.01); *H01L 24/94* (2013.01); *H01L 2224/0226* (2013.01); *H01L 2224/02245* (2013.01); *H01L 2224/02255* (2013.01); *H01L 2224/0401* (2013.01); *H01L 2224/04042* (2013.01); *H01L 2224/05124* (2013.01); *H01L 2224/05552* (2013.01);
(Continued)

(58) Field of Classification Search
CPC ... H01L 23/3157; H01L 23/147; H01L 25/50; H01L 25/0657; H01L 24/05; H01L 24/32; H01L 21/563
See application file for complete search history.

(56) References Cited

U.S. PATENT DOCUMENTS

2003/0189259 A1* 10/2003 Kurita et al. .................. 257/777
2005/0062166 A1* 3/2005 Kang et al. .................... 257/777
(Continued)

FOREIGN PATENT DOCUMENTS

JP 7-38033 2/1995
JP 11-135549 5/1999
(Continued)

*Primary Examiner* — A. Sefer

(57) ABSTRACT

A semiconductor device includes a rectangular lower semiconductor element; a plurality of external electrodes located in a pattern on the lower semiconductor element along sides thereof; a plurality of internal electrodes electrically connected to the plurality of external electrodes via a plurality of line patterns respectively and located on the lower semiconductor element in a pattern; dams provided in such a pattern that each of the dams encloses one or at least two external electrodes among the plurality of external electrodes; an upper semiconductor element mounted on the lower semiconductor element such that a plurality of terminals on the upper semiconductor element are electrically connected to the plurality of internal electrodes respectively; and a resin potted to flow to a space between the lower semiconductor element and the upper semiconductor element.

8 Claims, 13 Drawing Sheets

(51) Int. Cl.
  *H01L 21/56* (2006.01)
  *H01L 23/00* (2006.01)
  *H01L 25/065* (2006.01)
  *H01L 25/00* (2006.01)
  *H01L 23/14* (2006.01)
  *H01L 23/556* (2006.01)
  *H01L 23/498* (2006.01)

(52) U.S. Cl.
  CPC ......... *H01L 2224/05554* (2013.01); *H01L 2224/05571* (2013.01); *H01L 2224/05647* (2013.01); *H01L 2224/05655* (2013.01); *H01L 2224/06051* (2013.01); *H01L 2224/06155* (2013.01); *H01L 2224/06156* (2013.01); *H01L 2224/11462* (2013.01); *H01L 2224/131* (2013.01); *H01L 2224/16145* (2013.01); *H01L 2224/16225* (2013.01); *H01L 2224/26145* (2013.01); *H01L 2224/26175* (2013.01); *H01L 2224/2919* (2013.01); *H01L 2224/32145* (2013.01); *H01L 2224/32225* (2013.01); *H01L 2224/48227* (2013.01); *H01L 2224/73204* (2013.01); *H01L 2224/73207* (2013.01); *H01L 2224/73265* (2013.01); *H01L 2224/81193* (2013.01); *H01L 2224/92125* (2013.01); *H01L 2224/92225* (2013.01); *H01L 2224/92247* (2013.01); *H01L 2224/94* (2013.01); *H01L 2225/0651* (2013.01); *H01L 2225/06513* (2013.01); *H01L 2225/06568* (2013.01); *H01L 2924/10253* (2013.01); *H01L 2924/14* (2013.01); *H01L 2924/157* (2013.01); *H01L 2924/15311* (2013.01); *H01L 2924/19107* (2013.01)

(56) References Cited

U.S. PATENT DOCUMENTS

| | | | |
|---|---|---|---|
| 2006/0012038 A1* | 1/2006 | Miyazaki et al. | 257/737 |
| 2011/0001240 A1* | 1/2011 | Merilo et al. | 257/738 |
| 2012/0068353 A1* | 3/2012 | Huang et al. | 257/774 |
| 2014/0167263 A1* | 6/2014 | Wu et al. | 257/741 |

FOREIGN PATENT DOCUMENTS

| | | | |
|---|---|---|---|
| JP | 11-145183 | * | 5/1999 |
| JP | 2001-85475 | | 3/2001 |
| JP | 2001-257240 | | 9/2001 |
| JP | 2003-234362 | | 8/2003 |
| JP | 2005-276879 | | 10/2005 |
| JP | 2007-36035 | | 2/2007 |
| JP | 2007-42702 | | 2/2007 |

* cited by examiner

SEMICONDUCTOR DEVICE AND METHOD FOR PRODUCING THE SAME

CROSS REFERENCE TO RELATED APPLICATION

This application is based upon and claims the benefit of priority from the prior Japanese Patent Application No. 2012-253070, filed on Nov. 19, 2012; the entire contents of which are incorporated herein by reference.

FIELD

The present invention relates to a semiconductor device and a method for producing the same. Specifically, the present invention relates to a highly reliable semiconductor device of a CoC (chip-on-chip) structure which prevents an underfill resin from flowing into an external electrode (peripheral electrode) of a lower semiconductor element regardless of the size of an upper semiconductor element, and a method for producing the same.

BACKGROUND

Conventionally, a semiconductor device of a CoC (chip-on-chip) connection structure has been studied. With reference to FIG. 8, a specific structure of such a semiconductor device will be described. On a lower semiconductor chip 6 having external electrodes 9 formed on a surface thereof, an upper semiconductor chip 5 is mounted in a flip-flop manner with bumps 8 being held therebetween. A space between the lower semiconductor chip 6 and the upper semiconductor chip 5 and the bumps 8 are covered with an underfill resin 4 which has flown to the space as a result of being potted. The lower semiconductor chip 6 is mounted on a base substrate 2 with an adhesive 7 held therebetween, and the external electrodes 9 provided on a peripheral area of the lower semiconductor chip 6 and electrodes on the base substrate 2 are electrically connected to each other by bonding wires 10. On the base substrate 2, a resin 1 is provided to cover the upper semiconductor chip 5 and the lower semiconductor chip 6. On a rear surface of the base substrate 2, solder balls 3 are formed. The solder balls 3 are used for mounting the semiconductor device on a printed circuit board or the like.

The above-described semiconductor device of the CoC connection structure involves an undesirable possibility that the underfill resin 4 provided by potting flows onto surfaces of the external electrodes 9 and thus inhibits electrical contact between the external electrodes 9 and the bonding wires 10.

Japanese Laid-Open Patent Publication No. 2003-234362 (Patent Document 1) and Japanese Laid-Open Patent Publication No. 2005-276879 (Patent Document 2) each disclose a semiconductor device including a dam in order to prevent the underfill resin 4 provided by potting from reaching the surfaces of the external electrodes 9. A semiconductor device obtained by applying such a dam to the semiconductor device shown in FIG. 8 will be described with reference to FIGS. 9, 10 and 11.

FIG. 9 is a cross-sectional view of a semiconductor device including a dam 11 in order to prevent the underfill resin 4 provided by potting from reaching the surfaces of the external electrodes 9. FIG. 10 is a plan view of a lower semiconductor chip 6 of the semiconductor device shown in FIG. 9. FIG. 11 is a cross-sectional view of an upper semiconductor chip 5 and the lower semiconductor chip 6 of the semiconductor device shown in FIG. 9 which are immediately after being CoC-connected to each other. When the underfill resin 4 is potted to an area between the dam 11 and the upper semiconductor chip 5 in this state, the underfill resin 4 expands as shown in the cross-sectional view of FIG. 9. Even though flowing externally, the underfill resin 4 is stopped by the dam 11 to a certain extent. Therefore, the surfaces of the external electrodes 9 are not covered with the underfill resin 4. This decreases the possibility that the electrical contact between the external electrodes 9 and the bonding wires 10 is inhibited.

However, in the conventional semiconductor device of the CoC connection structure, once the underfill resin 4 flowing externally flows beyond the dam 11, the surfaces of many external electrodes 9 are covered with the underfill resin 4. This inhibits electrical contact between the external electrodes 9 and the bonding wires 10. In order to avoid such a problem, the dam 11 and the upper semiconductor chip 5 need to be located sufficiently far from each other, and the amount of the underfill resin 4 needs to be controlled precisely. These prevent size reduction and mass production of the semiconductor device. In addition, in the conventional semiconductor device of the CoC connection structure, the dam 11 which encloses internal electrodes is formed of only one line. Such a dam 11 involves an undesirable possibility of being delaminated off during heat treatment or resin potting.

The present invention made in light of the above-described problems has an object of providing a semiconductor device of a CoC connection structure which does not inhibit electrical contact between external electrodes and line patterns and is not prevented from being reduced in size or from being mass-produced, and a method for producing such a semiconductor device.

SUMMARY

In order to solve the above-described problems, a semiconductor device in an embodiment according to the present invention includes a rectangular lower semiconductor element; a plurality of external electrodes located in a pattern on the lower semiconductor element along sides thereof; a plurality of internal electrodes electrically connected to the plurality of external electrodes via a plurality of line patterns respectively and located on the lower semiconductor element in a pattern; dams provided in such a pattern that each of the dams encloses one or at least two external electrodes among the plurality of external electrodes; an upper semiconductor element mounted on the lower semiconductor element such that a plurality of terminals on the upper semiconductor element are electrically connected to the plurality of internal electrodes respectively; and a resin potted to flow to a space between the lower semiconductor element and the upper semiconductor element.

It is preferable that the dams are formed of solder and are formed at the same time as solder bumps formed on the internal electrodes.

It is preferable that an insulating film is provided on a surface of the lower semiconductor element; the plurality of line patterns are provided on the insulating film; and an insulating thin film having openings positionally corresponding to the plurality of internal electrodes and the plurality of external electrodes is provided on the line patterns.

It is preferable that the dams have a gap therebetween, the gap extending from an area where the resin is potted to an external peripheral area of the lower semiconductor element.

It is preferable that at least one of the dams encloses at least two external electrodes among the plurality of external electrodes and extends between the at least two external electrodes.

In order to solve the above-described problems, a method for producing a semiconductor device in an embodiment according to the present invention includes the steps of: forming, on a rectangular lower semiconductor element, a plurality of external electrodes located in a pattern along sides of the lower semiconductor element, a plurality of internal electrodes located in a pattern, and line patterns for electrically connecting the plurality of external electrodes and the plurality of internal electrodes to each other respectively; forming dams such that each of the dams encloses one or at least two external electrodes among the plurality of external electrodes; mounting an upper semiconductor element on the lower semiconductor element such that a plurality of terminals on the upper semiconductor element are electrically connected to the plurality of internal electrodes respectively; and potting a resin such that the resin flows to a space between the lower semiconductor element and the upper semiconductor element.

It is preferable that the dams are formed of solder and are formed at the same time as solder bumps formed on the internal electrodes.

It is preferable that an insulating film is formed on a surface of the lower semiconductor element; the plurality of line patterns are formed on the insulating film; and an insulating thin film having openings positionally corresponding to the plurality of internal electrodes and the plurality of external electrodes is formed on the line patterns.

It is preferable that the dams are formed to have a gap therebetween, the gap extending from an area where the resin is to be potted to an external peripheral area of the lower semiconductor element.

It is preferable that the dams are formed such that at least one of the dams encloses at least two external electrodes among the plurality of external electrodes and extends between the at least two external electrodes.

The present invention provides a semiconductor device of a CoC connection structure which does not inhibit electrical contact between external electrodes and line patterns and is not prevented from being reduced in size or from being mass-produced, and a method for producing such a semiconductor device. Other effects of the present invention will be described below in detail.

DESCRIPTION OF EMBODIMENTS

Figure 1:
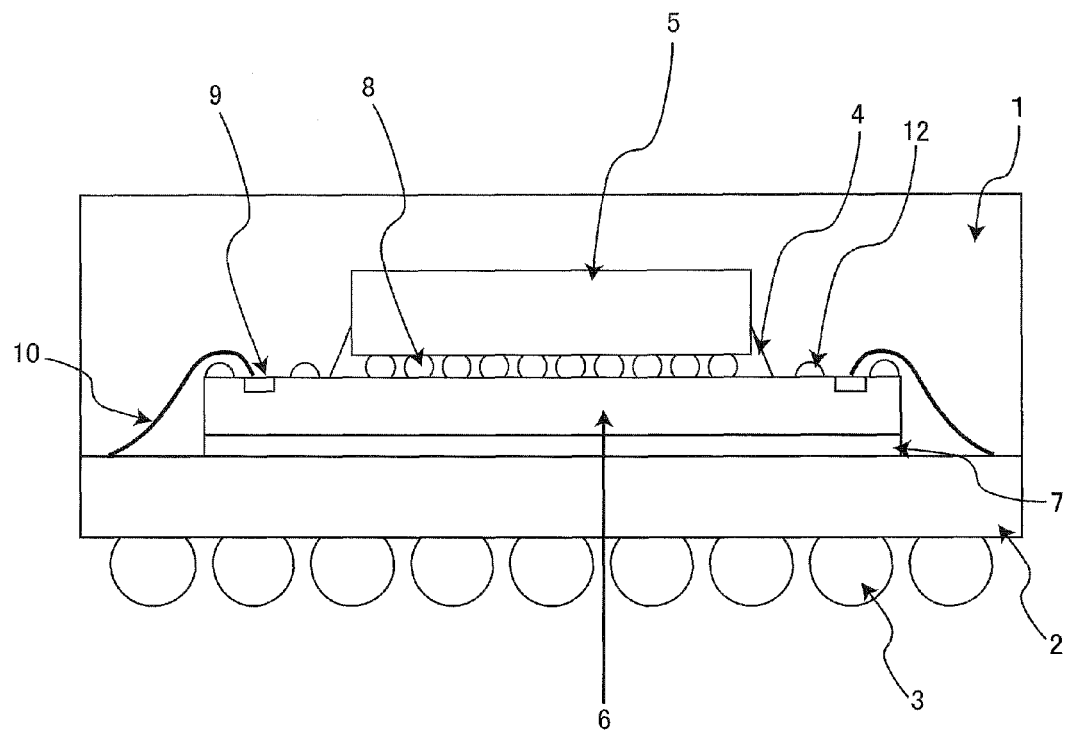
FIG. 1 is a cross-sectional view of a semiconductor device in an embodiment according to the present invention.

Hereinafter, embodiments according to the present invention will be described with reference to FIG. 1 through FIG. 7. In the embodiments, identical components will bear identical reference numerals and the same descriptions will not be repeated.

FIG. 1 is a cross-sectional view of a semiconductor device in an embodiment according to the present invention. The semiconductor device includes a lower semiconductor chip 6 mounted on a base substrate 2 and an upper semiconductor chip 5 mounted on the lower semiconductor chip 6 as main components.

Figure 2:
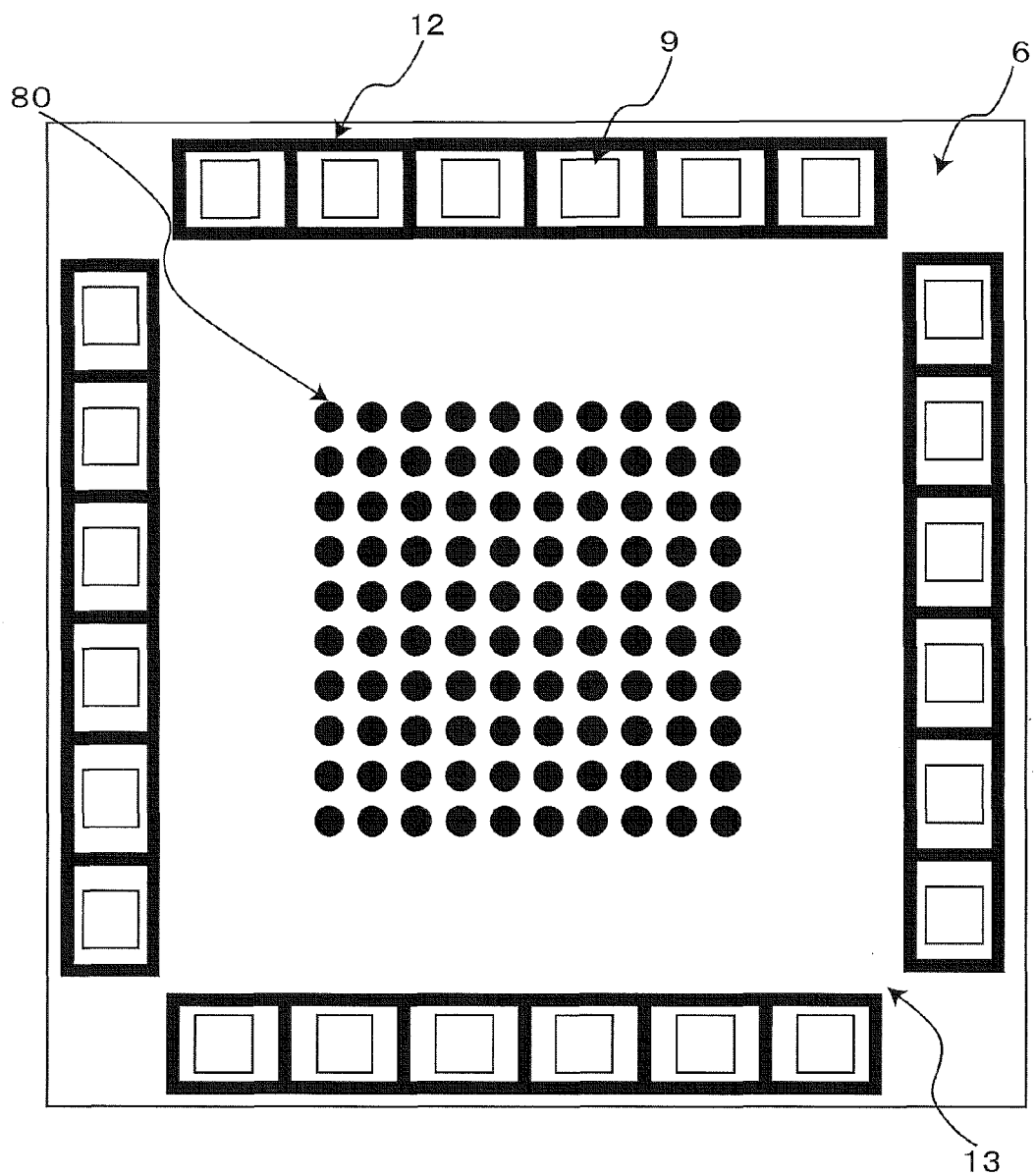
FIG. 2 is a plan view of a lower semiconductor chip in an embodiment according to the present invention.

FIG. 2 is a plan view of the lower semiconductor chip 6 in an embodiment according to the present invention. The lower semiconductor chip 6 is rectangular, and external electrodes 9 are located on a surface of the lower semiconductor chip 6 along four sides thereof. In the figure, a plurality of external electrodes 9 are located in one line along each side. Alternatively, the external electrodes 9 may be located in two lines or in a staggered manner. Internal electrodes 80 are located in rows by columns on the lower semiconductor chip 6 and are electrically connected to the upper semiconductor chip 5.

Hereinafter, each of the components of the semiconductor device will be described along with the steps of production thereof.

The lower semiconductor chip 6 includes a silicon substrate, and may or may not have an integrated circuit formed on a surface thereof. In either case, an uppermost layer of the lower semiconductor chip 6 is, for example, a silicon nitride film 71. On the uppermost layer, the external electrodes 9, the internal electrodes 80 and lines for connecting the external electrodes 9 and the internal electrodes 80 to each other are formed of a copper thin film. On these copper lines and the like, a polyimide insulating film 72 having a thickness of 5 μm is formed in this example. The polyimide insulating film has openings for exposing the external electrodes 9, the internal electrodes 80 and dummy lines (on which dams 12 are to be formed) formed of a copper thin film. The dummy lines formed of a copper thin film may be formed at the same time as the external electrodes 9, the internal electrodes 80 and the lines for connecting the external electrodes 9 and the internal electrodes 80 to each other. The polyimide insulating film is applied by, for example, spin coating, and the openings are formed by etching. Formation of the polyimide insulating film can prevent damages of, for example, the lines formed of a copper thin film or the like for connecting the external electrodes 9 and the internal electrodes 80 to each other, and also can block a line, which causes a so-called soft error.

The internal electrodes 80 formed on the lower semiconductor chip 6 each have an aluminum pad of an optional shape, for example, an octagonal shape having a diameter of 20 μm. The internal electrodes 80 are located in, for example, 30 rows by 30 columns. The internal electrodes 80 are located at a pitch of, for example, 40 μm.

The external electrodes 9 on the surface of the lower semiconductor chip 6 are grouped, and each group of external electrodes 9 is located along one side of the lower semiconductor chip 6. Dams 12 are formed on the dummy lines of a copper thin film which are exposed by the openings of the polyimide insulating film. Each of the dams 12 encloses one group of external electrodes 9. Each dam 12 is formed in a ladder shape; namely, encloses the corresponding group of external electrodes 9 and also extends between adjacent external electrodes 9. The dams 12 are provided in such a pattern are separated from each other at positions in the vicinity of four corners of the lower semiconductor chip 6, and gaps 13 through which the underfill resin 4 flows to an external peripheral area of the lower semiconductor chip 6 are provided at these positions. The dams 12 are formed of solder, and each have a width of 45 μm to 55 μm and a height of 15 μm to 25 μm. More preferably, the dams 12 each have a width of 50 μm and a height of 20 μm. On surfaces of the internal electrodes 80 also, solder layers 81 (shown in FIG. 3) are formed. The solder layers 81 are formed at the same time as the dams 12 by, for example, electrolytic plating with a barrier metal layer formed of nickel or the like being held between the internal electrodes 80 and the solder layers 81. The above description has been made regarding one lower semiconductor chip 6. In actuality, the solder layers 81 on the surfaces of the internal electrodes 80 and the dams 12 are formed on a wafer including a plurality of lower semiconductor chips 6. After this, the wafer is cut into individual lower semiconductor chips 6. Then, each lower semiconductor chip 6 is joined with the upper semiconductor chip 5, and the space between the lower semiconductor chip 6 and the upper semiconductor chip 5 is filled with the underfill resin 4, as described later.

Figure 3:
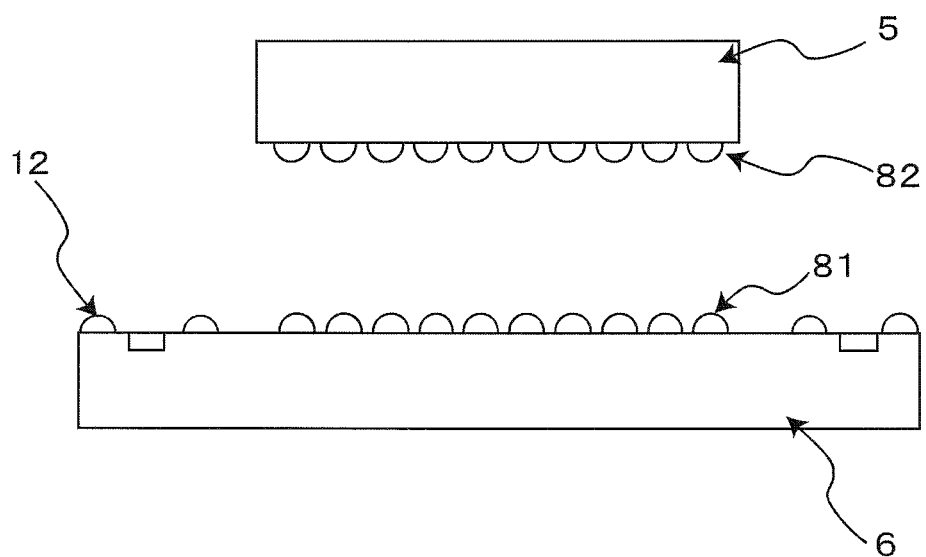
FIG. 3 is a cross-sectional view of the lower semiconductor chip and an upper semiconductor chip in an embodiment according to the present invention before being CoC-connected to each other.
Figure 4:
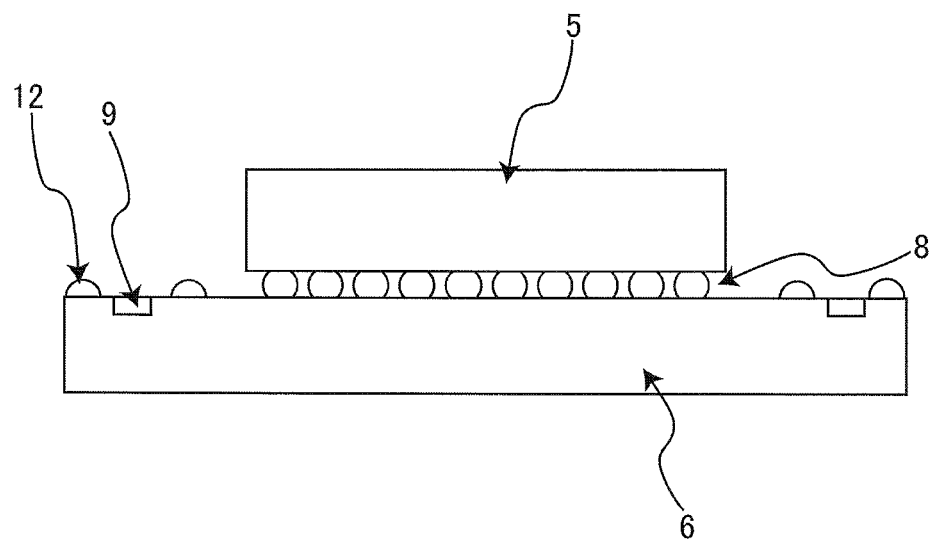
FIG. 4 is a cross-sectional view of the lower semiconductor chip and the upper semiconductor chip in an embodiment according to the present invention which are CoC-connected to each other.

FIG. 3 is a cross-sectional view of the lower semiconductor chip 6 and the upper semiconductor chip 5 in an embodiment according to the present invention before being CoC-connected to each other. From the surface of the lower semiconductor chip 6, the dams 12 formed of solder and solder layers 81 formed of solder on the surfaces of the internal electrodes 80 protrude upward. On a surface electrode of the upper semiconductor chip 5 which already has an integrated circuit formed thereon, solder layers 82 are formed. The solder layers 81 and the solder layers 82 are positionally aligned, and thus the upper semiconductor chip 5 and the lower semiconductor chip 6 are CoC-connected to each other. The heating temperature in this step is about 260° C., which is higher than the melting point of solder. Therefore, the solder layers 81 and the solder layers 82 are fused and bonded together. As a result, as shown in FIG. 4, drumstick-like bumps 8 are formed.

In the state where the CoC-connected upper semiconductor chip 5 and lower semiconductor chip 6 are kept at about 100° C., the underfill resin 4 is potted to an area between the upper semiconductor chip 5 and the dams 12. As the underfill resin 4, an epoxy resin is used. As a result, the space between the lower semiconductor chip 6 and the upper semiconductor chip 5 is filled with the underfill resin 4 and the bumps 8 are covered with the underfill resin 4, because of the surface tension of the underfill resin 4 (see FIG. 1). Even if the underfill resin 4 is about to overflow top surfaces of the dams 12 for a reason that the amount of the underfill resin 4 is too large or the distance between the dams 12 and the upper semiconductor chip 5 is too short, the underfill resin 4 escapes to the external peripheral area of the lower semiconductor chip 6 via the gaps 13. Therefore, the underfill resin 4 does not flow onto the external electrodes 9. In addition, since the dams 12 enclose the external electrodes 9, the underfill resin 4 which has escaped to the external peripheral area of the lower semiconductor chip 6 does not turn to flow onto the external electrodes 9. The underfill resin 4, which is generally thermosetting, is cured when being heated to 150° C. The flow of the underfill resin 4 may apply a deforming pressure on the dams 12. However, since the dams 12 are formed in a ladder shape, the contact area size between the dummy lines of a copper thin film and the solder is increased and thus the adhesiveness therebetween is improved. Therefore, the dams 12 are not deformed.

Next, the lower semiconductor chip 6 is mounted on the base substrate 2 with an adhesive 7 held therebetween. The external electrodes 9 in the peripheral area of the lower semiconductor chip 6 and the electrodes on the base substrate 2 are electrically connected to each other via bonding wires 10. On the base substrate 2, a resin 1 is formed to cover the upper semiconductor chip 5 and the lower semiconductor chip 6. The resin 1 is an epoxy resin. In a final step, solder balls 3 are formed on a rear surface of the base substrate 2. The solder balls 3 are used for mounting the resultant semiconductor device on a printed circuit board or the like.

Figure 5:
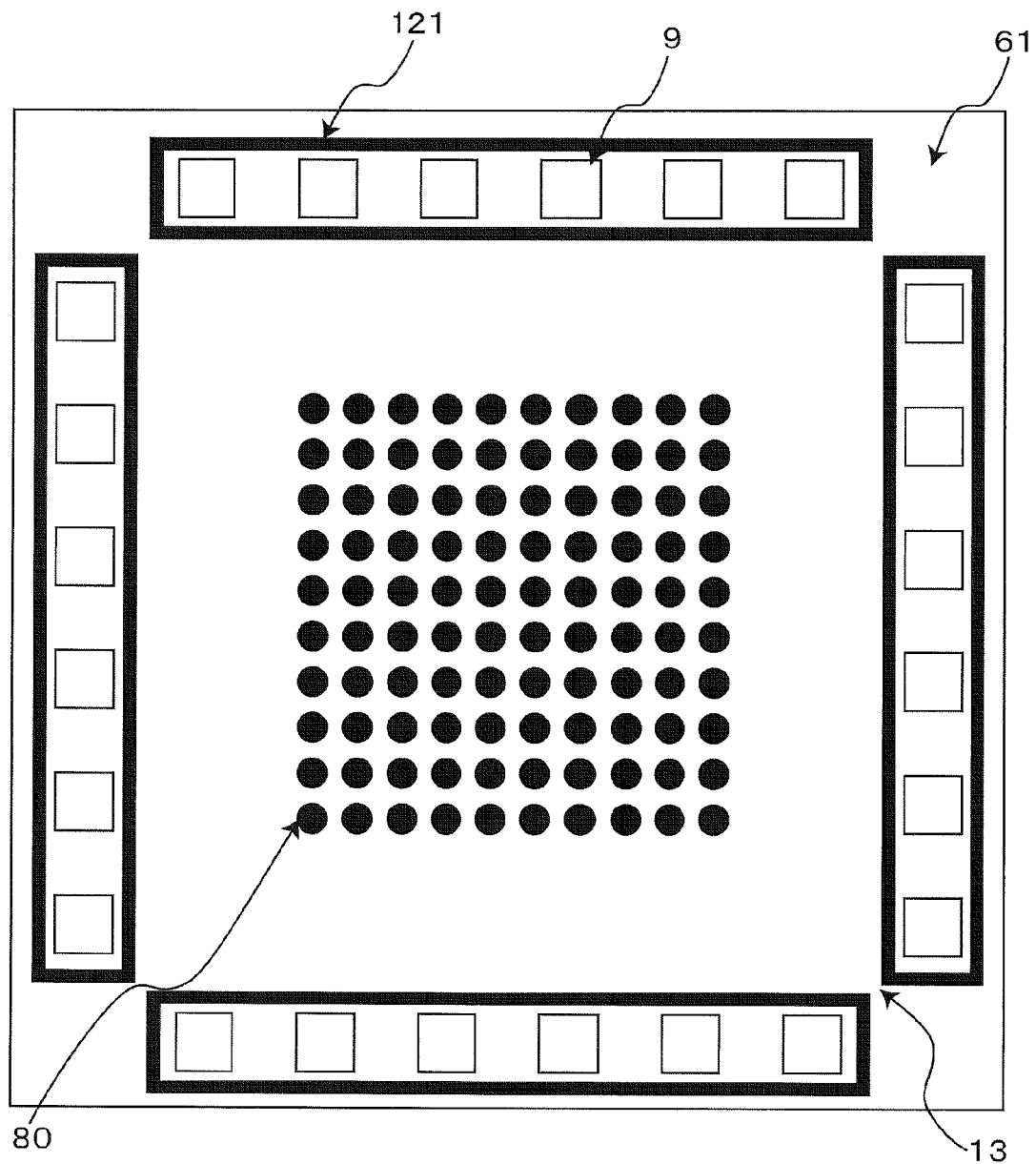
FIG. 5 is a plan view of a lower semiconductor chip in a first modification of the embodiment according to the present invention.

FIG. 5 is a plan view of a lower semiconductor chip 61 in a first modification of the embodiment according to the present invention. The lower semiconductor chip 61 is different from the lower semiconductor chip 6 shown in FIG. 2 in the pattern of dams 121. In the first modification, the external electrodes 9 located along the four sides of the lower semiconductor chip 61 are grouped, and the groups of external electrodes 9 are each enclosed by one dam 121. The dams 121 do not extend between adjacent external electrodes 9. The dams 121 provided in such a pattern are separated from each other at positions in the vicinity of four corners of the lower semiconductor chip 61, and gaps 13 through which the underfill resin 4 flows to an external peripheral area of the lower semiconductor chip 6 are provided at these positions. This structure can also achieve the object of the present invention.

Figure 6:
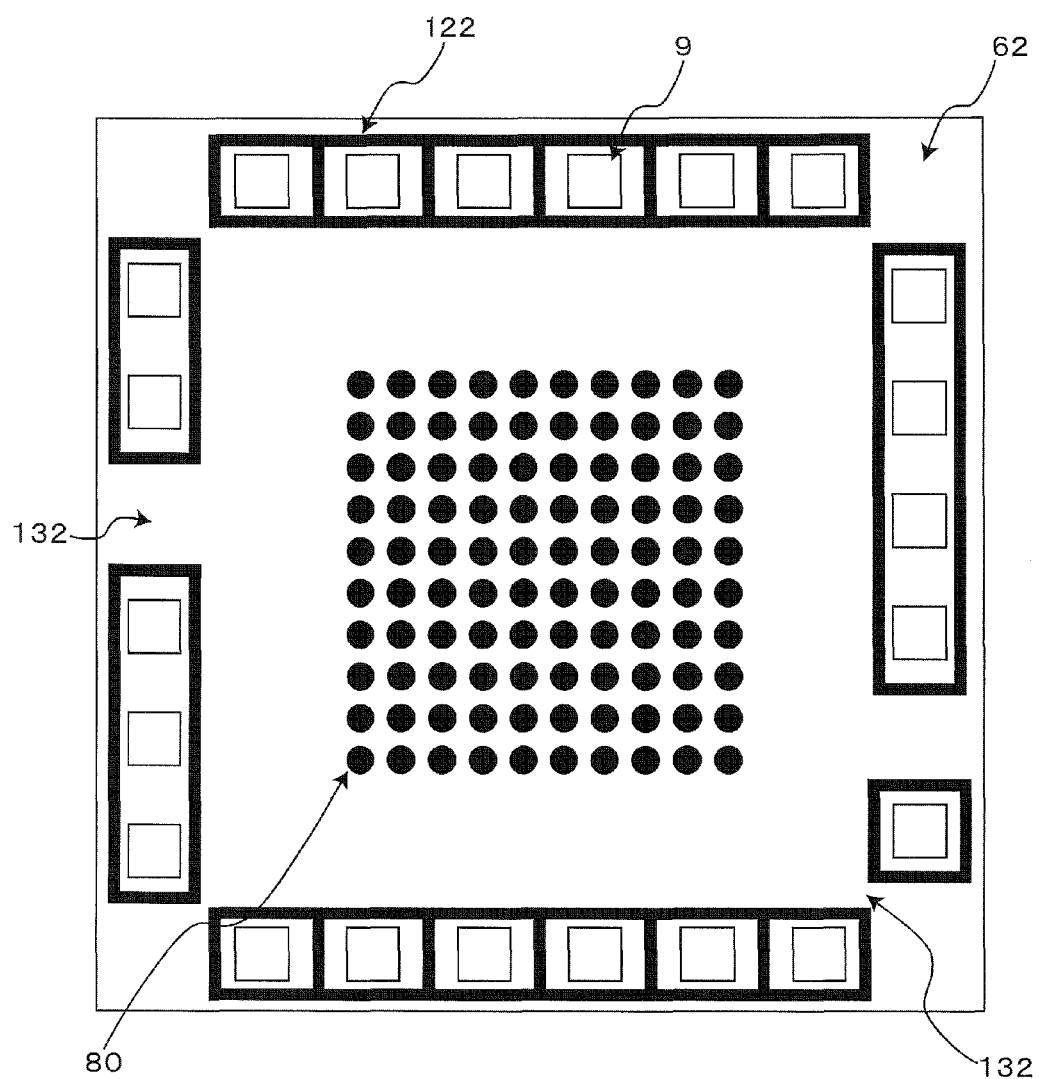
FIG. 6 is a plan view of a lower semiconductor chip in a second modification of the embodiment according to the present invention.

FIG. 6 is a plan view of a lower semiconductor chip 62 in a second modification of the embodiment according to the present invention. The lower semiconductor chip 62 is different from the lower semiconductor chip 6 shown in FIG. 2 in the pattern of dams 122. In the second modification, the external electrodes 9 located along the four sides of the lower semiconductor chip 62 are partially missing and thus gaps 132 are provided. The groups of external electrodes 9 separated from each other by the gaps 132 are enclosed by the dams 122 of different shapes from each other. The gaps 132 thus provided are large. Therefore, a larger amount of underfill resin 4 is allowed to flow to an external peripheral area of the lower semiconductor chip 62 than in the above embodiment and modification. This prevents the underfill resin 4 from flowing onto the external electrodes 9.

Figure 7:
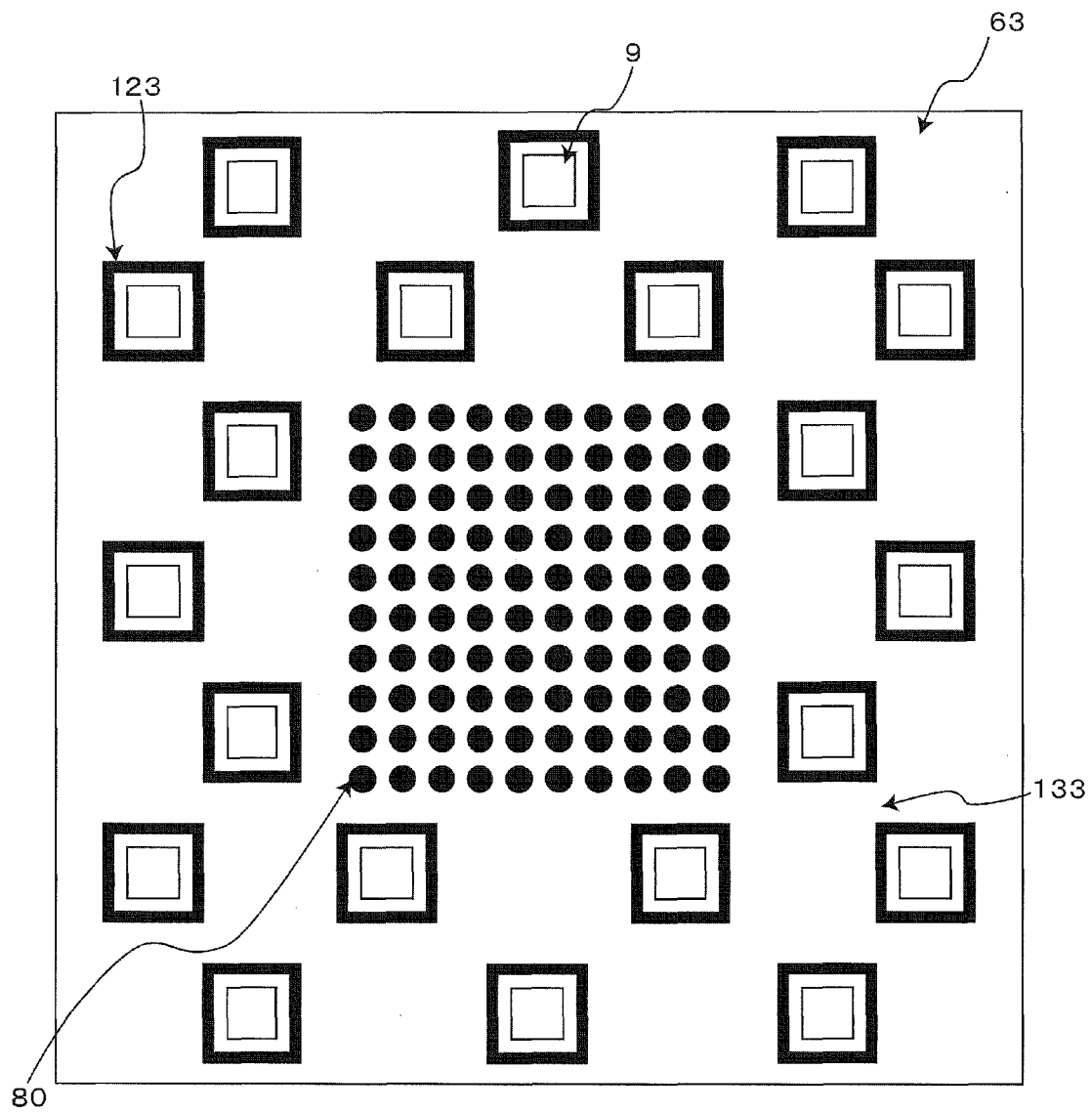
FIG. 7 is a plan view of a lower semiconductor chip in a third modification of the embodiment according to the present invention.
Figure 8:
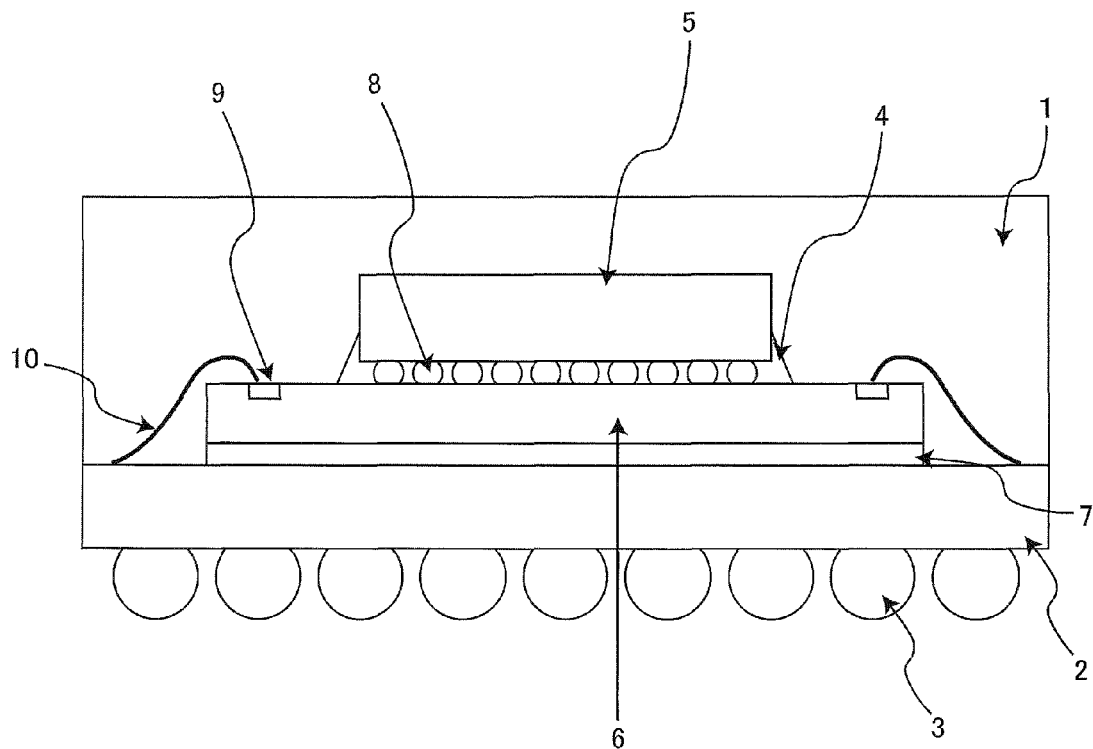
FIG. 8 is a cross-sectional view of a conventional semiconductor device (with no dam)
Figure 9:
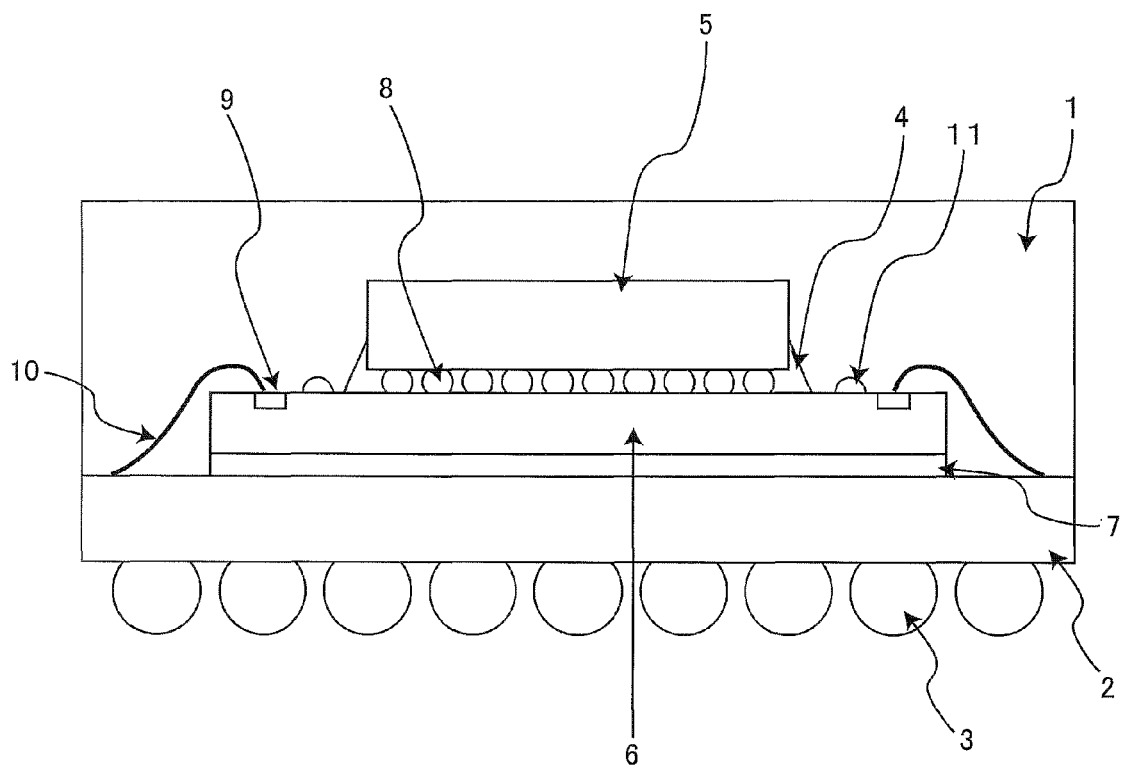
FIG. 9 is a cross-sectional view of a conventional semiconductor device (with a dam)
Figure 10:
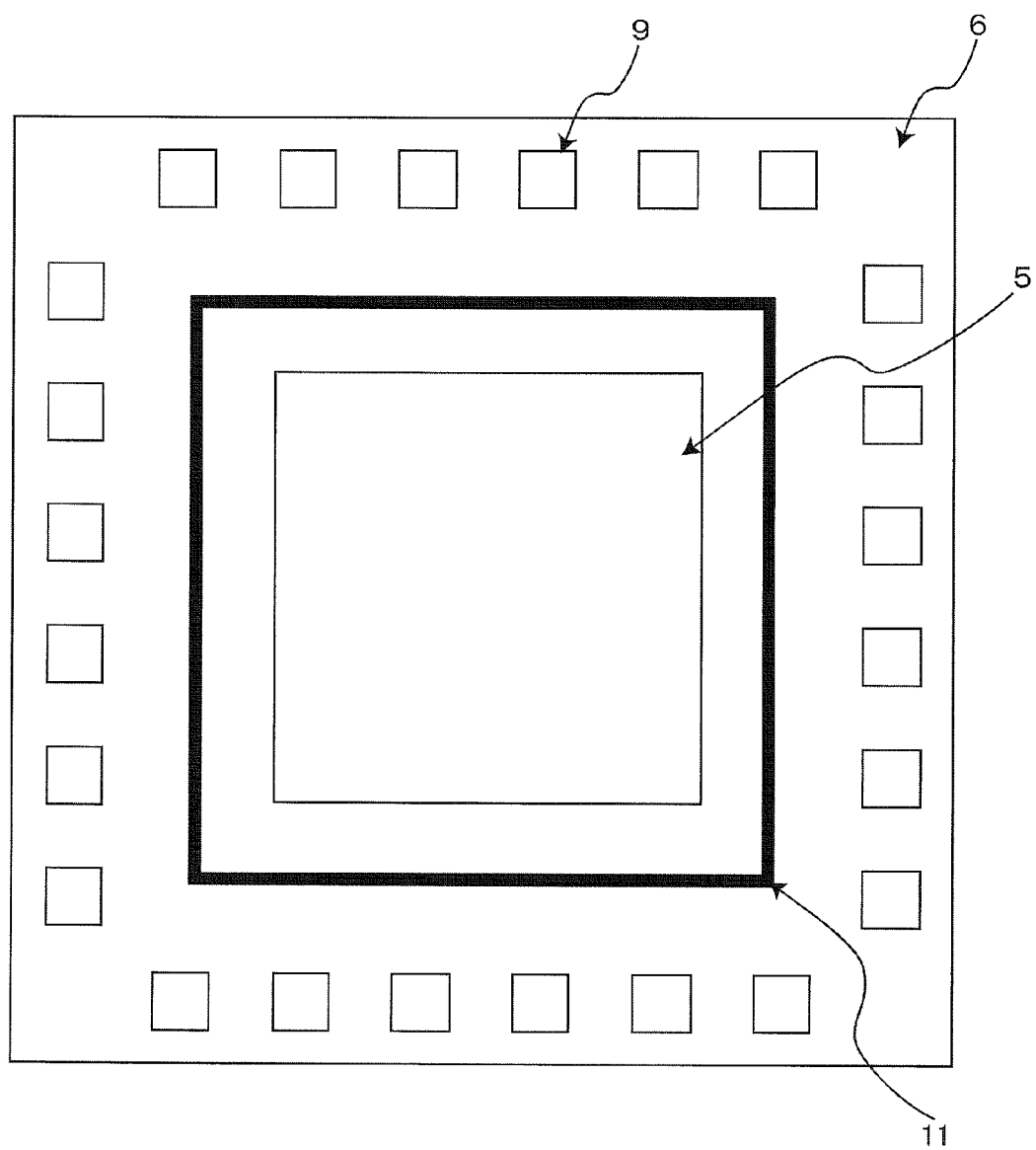
FIG. 10 is a plan view of a lower semiconductor chip in the conventional semiconductor device.
Figure 11:
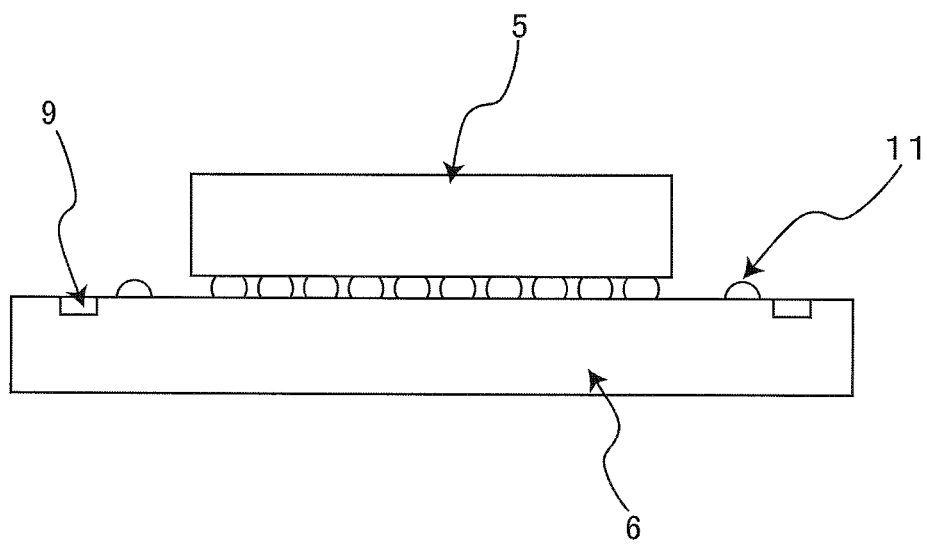
FIG. 11 is a cross-sectional view of the lower semiconductor chip and an upper semiconductor chip of the conventional semiconductor device which are CoC-connected to each other.
Figure 12:
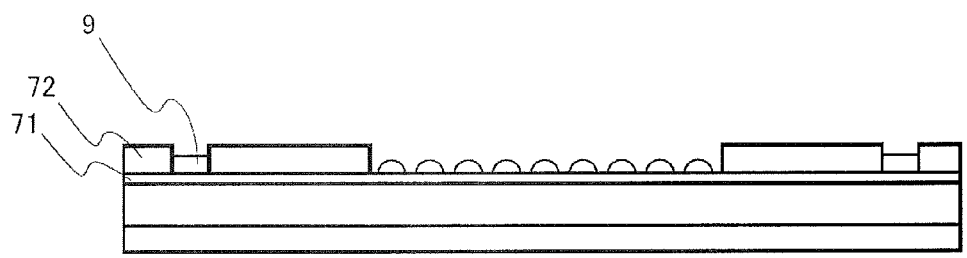
FIG. 12 is a plan view of a lower semiconductor chip having lines for connecting the external electrodes and the internal electrodes to each other.
Figure 13:
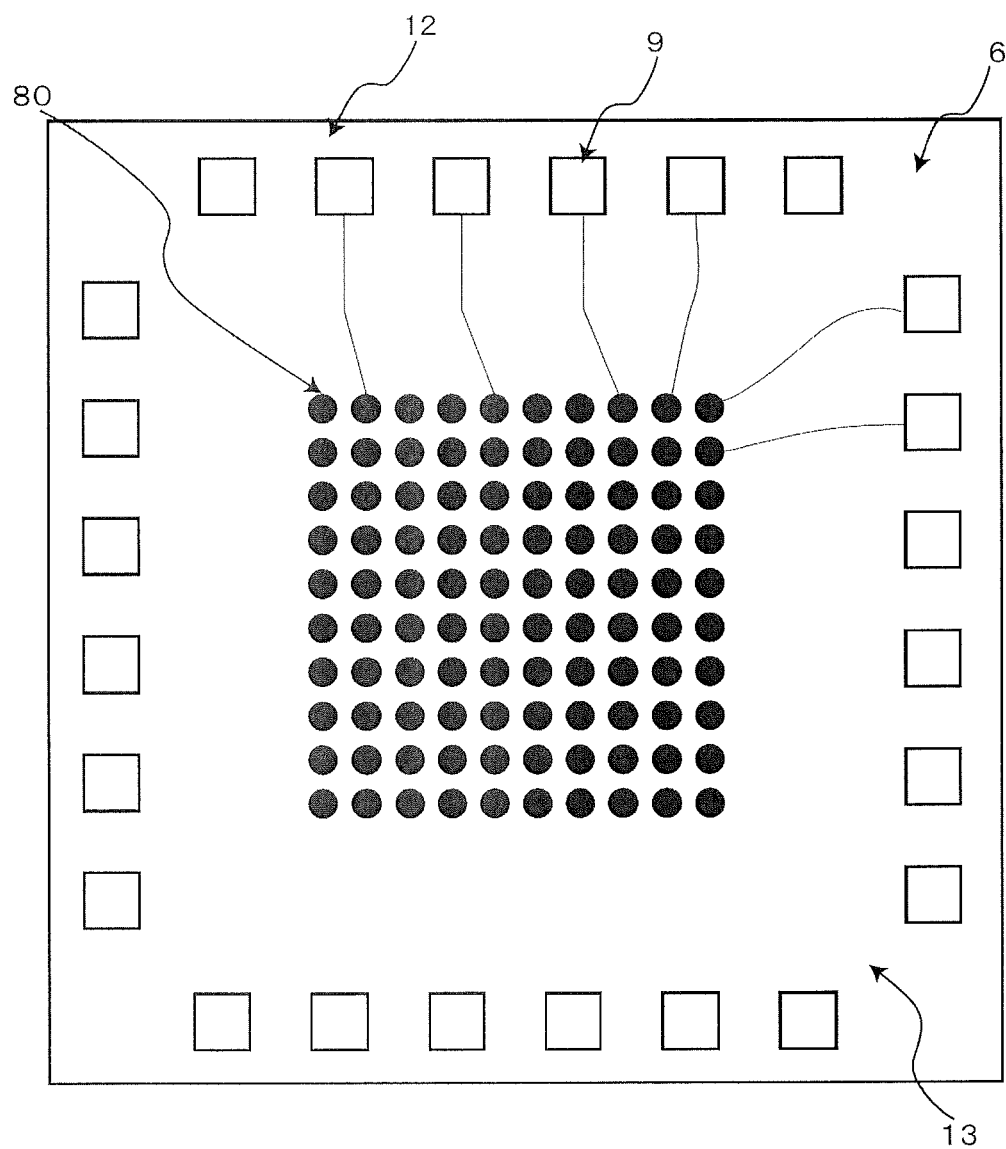
FIG. 13 is a cross sectional view of a semiconductor device having insulating films.

FIG. 7 is a plan view of a lower semiconductor chip 63 in a third modification of the embodiment according to the present invention. The lower semiconductor chip 63 is different from the lower semiconductor chip 6 shown in FIG. 2 in the pattern of the external electrodes 9 and the pattern of dams 123. In the third modification, the external electrodes 9 are located in two lines in a staggered manner along each side, and each external electrode is enclosed by one dam 123. This structure provides many gaps 133 extending to an external peripheral area of the lower semiconductor chip 63. Therefore, a larger amount of underfill resin 4 is allowed to flow to the external peripheral area of the lower semiconductor chip 63 than in the above embodiment and modifications. This prevents the underfill resin 4 from flowing onto the external electrodes 9.

So far, an embodiment according to the present invention and various modifications thereof have been described. The present invention is not limited to the above-described embodiment or modifications, and may be carried out in any of various modifications without departing from the gist of the present invention. For example, the dams are formed of solder at the same time as the solder bumps in the above description, but may be formed of a resin sheet of polyimide or epoxy instead of solder. The patterns of the external electrodes and the internal electrodes are variable in any of various manners.

The embodiment of the present invention and various modifications thereof provide any of the following effects.

(1) The present invention provides a semiconductor device of a CoC connection which does not inhibit electrical contact between the external electrodes and the bonding wires and is not prevented from being reduced in size or from being mass-produced, and a method for producing such a semiconductor device.

(2) In the case where solder is used to form dams in the present invention, the solder bumps on the internal electrodes and the dams can be formed at the same time. This simplifies the production process.

(3) In the case where solder is used to form dams and the dams are provided in certain patterns in the present invention, the adhesiveness between the dams and the underlying layer is improved, which prevents the dams from being delaminated off.

What is claimed is:

1. A semiconductor device, comprising:
a rectangular lower semiconductor element;
a first insulating film provided on a surface of the lower semiconductor element;
a plurality of external electrodes located in a pattern on the first insulating film along sides thereof;
a plurality of internal electrodes electrically connected to the plurality of external electrodes via a plurality of line patterns respectively and located in a pattern on the first insulating film;
a second insulating film, being a thin film, having openings positionally corresponding to the plurality of internal electrodes and the plurality of external electrodes, and provided on the plurality of line patterns;
dams provided in such a pattern that each of the dams encloses one or at least two external electrodes among the plurality of external electrodes;
an upper semiconductor element mounted on the lower semiconductor element such that a plurality of terminals on the upper semiconductor element are electrically connected to the plurality of internal electrodes respectively; and
a resin potted to flow to a space between the lower semiconductor element and the upper semiconductor element.

2. A semiconductor device according to claim 1, wherein the dams are formed of solder and are formed at the same time as solder bumps formed on the internal electrodes.

3. A semiconductor device according to claim 1, wherein the dams have a gap therebetween, the gap extending from an area where the resin is potted to an external peripheral area of the lower semiconductor element.

4. A semiconductor device according to claim 1, wherein at least one of the dams encloses at least two external electrodes among the plurality of external electrodes and extends between the at least two external electrodes.

5. A method for producing a semiconductor device, comprising:
forming, on a rectangular lower semiconductor element, a first insulating film located on a surface of the lower semiconductor element;
forming a plurality of line patterns located on the first insulating film;
forming a plurality of external electrodes located in a pattern along sides of the first insulating film, a plurality of internal electrodes located in a pattern on first insulating film, and line patterns for electrically connecting the plurality of external electrodes and the plurality of internal electrodes to each other respectively on the first insulating film;
forming a second insulating film, being a thin film and having openings positionally corresponding to the plurality of internal electrodes and the plurality of external electrode, on the line patterns;
forming dams such that each of the dams encloses one or at least two external electrodes among the plurality of external electrodes;
mounting an upper semiconductor element on the lower semiconductor element such that a plurality of terminals on the upper semiconductor element are electrically connected to the plurality of internal electrodes respectively; and
potting a resin such that the resin flows to a space between the lower semiconductor element and the upper semiconductor element.

6. A method for producing a semiconductor device according to claim 5, wherein the dams are formed of solder and are formed at the same time as solder bumps formed on the internal electrodes.

7. A method for producing a semiconductor device according to claim 5, wherein the dams are formed to have a gap therebetween, the gap extending from an area where the resin is to be potted to an external peripheral area of the lower semiconductor element.

8. A method for producing a semiconductor device according to claim 5, wherein the dams are formed such that at least one of the dams encloses at least two external electrodes among the plurality of external electrodes and extends between the at least two external electrodes.

* * * * *